(12) United States Patent
Borden et al.

(10) Patent No.: US 8,929,845 B2
(45) Date of Patent: Jan. 6, 2015

(54) INSTRUMENT LO USED AS ALIGNMENT SIGNAL SOURCE

(71) Applicant: Tektronix, Inc., Beaverton, OR (US)

(72) Inventors: Franklin Merlin Borden, Sherwood, OR (US); Marcus Kieling Da Silva, Portland, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 13/774,799

(22) Filed: Feb. 22, 2013

(65) Prior Publication Data
US 2014/0242937 A1 Aug. 28, 2014

(51) Int. Cl.
H04B 17/00 (2006.01)
H04B 1/26 (2006.01)
H04B 1/16 (2006.01)
H03D 1/22 (2006.01)
H04L 27/22 (2006.01)
H03D 7/14 (2006.01)

(52) U.S. Cl.
CPC .. H04B 1/16 (2013.01); H03D 1/22 (2013.01); H04B 17/0062 (2013.01); H04L 27/22 (2013.01); H03D 7/1466 (2013.01); H03D 2200/0045 (2013.01)
USPC .......................... 455/226.1; 455/318; 455/324

(58) Field of Classification Search
USPC ............. 455/67.11, 67.14, 226.1, 226.2, 318, 455/324; 324/76.19, 76.23
See application file for complete search history.

(56) References Cited

U.S. PATENT DOCUMENTS

| 4,138,645 | A | 2/1979 | Parato |
| 2003/0165203 | A1 | 9/2003 | Mohindra |
| 2005/0069056 | A1* | 3/2005 | Willingham ................. 375/327 |
| 2008/0113625 | A1* | 5/2008 | Maeda et al. ............... 455/67.14 |
| 2010/0151806 | A1* | 6/2010 | Firoiu et al. ................ 455/192.2 |
| 2012/0300818 | A1 | 11/2012 | Metreaud et al. |
| 2013/0069738 | A1* | 3/2013 | Tsuie ........................... 333/100 |

FOREIGN PATENT DOCUMENTS

EP     1067675 A1    1/2001

OTHER PUBLICATIONS

European Search Report for European Patent Application No. 14156199.3, dated May 9, 2014, 6 pages.

* cited by examiner

Primary Examiner — Nguyen Vo
(74) Attorney, Agent, or Firm — Marger Johnson & McCollom PC

(57) ABSTRACT

A system can include an input signal source, a local oscillator (LO), and an intermediate frequency (IF) receiver to receive an input signal from the input signal source and an LO signal from the LO. The IF receiver can include a switch to switch between the first and second inputs to provide an output. The IF receiver can generate a calibration signal from the LO signal.

14 Claims, 2 Drawing Sheets

US 8,929,845 B2

INSTRUMENT LO USED AS ALIGNMENT SIGNAL SOURCE

BACKGROUND

Various types of electronic devices, such as spectrum analyzers, usually have multiple input signals. One such input signal, which is generally referred to herein as a reference signal, is typically used to adjust for gain variations over time and temperature. However, because it is often significantly expensive to design and build an accurate and leveled source at many frequencies, the reference signal is usually a fixed source signal at a relatively low frequency such that its complexity and cost can be at least somewhat controlled. This source is typically calibrated in connection with being generated at the factory.

Accordingly, there remains a need for improved electronic device designs that do not require a discrete reference signal input.

SUMMARY

Embodiments of the disclosed technology generally include systems and devices in which a local oscillator (LO) input may be used as an alignment signal source. In certain embodiments, a power detector may be used to measure the power level of the LO input. A mixer may be optionally inserted into the reference signal path to allow for modulation or application of frequency offset to the calibration signal.

DETAILED DESCRIPTION

In current electronic systems and devices, such as spectrum analyzers, a single reference frequency is typically used to adjust for gain changes that are consistent across all input frequencies. However, this is usually an issue with system architectures having devices in the radio frequency (RF) path that have variations in their frequency response over time, temperature, or both.

In certain embodiments of the disclosed technology, the local oscillator (LO) frequency of an electronic device, such as a Direct Conversion Receiver, is generally the center frequency of the incoming RF bandwidth. This LO frequency may be used as a reference signal for alignment and also to convert an incoming RF signal to baseband. That is, whereas conventional systems require a separate calibration signal in addition to the source signal, embodiments of the disclosed technology generally use the source signal for calibration.

In certain embodiments, a power detector may be used to measure the power level of the LO signal. Such power detector may be calibrated at the factory. Unlike current calibration methods, this architecture may advantageously provide a reference signal over the entire RF range for the device.

Gain may be optionally added prior to the power detector to keep the power at the detector relatively high so that it may be accurately measured. Alternatively or in addition thereto, an attenuator may be added after the power detector to reduce the signal level to near full scale of the instrument, or to some other desired calibration level. In such embodiments, the calibration signal may be injected after or ahead of the test instrument input attenuator.

In certain embodiments, a mixer may be optionally inserted into the reference signal path to allow for modulation or application of frequency offset to the calibration signal.

Figure 1:
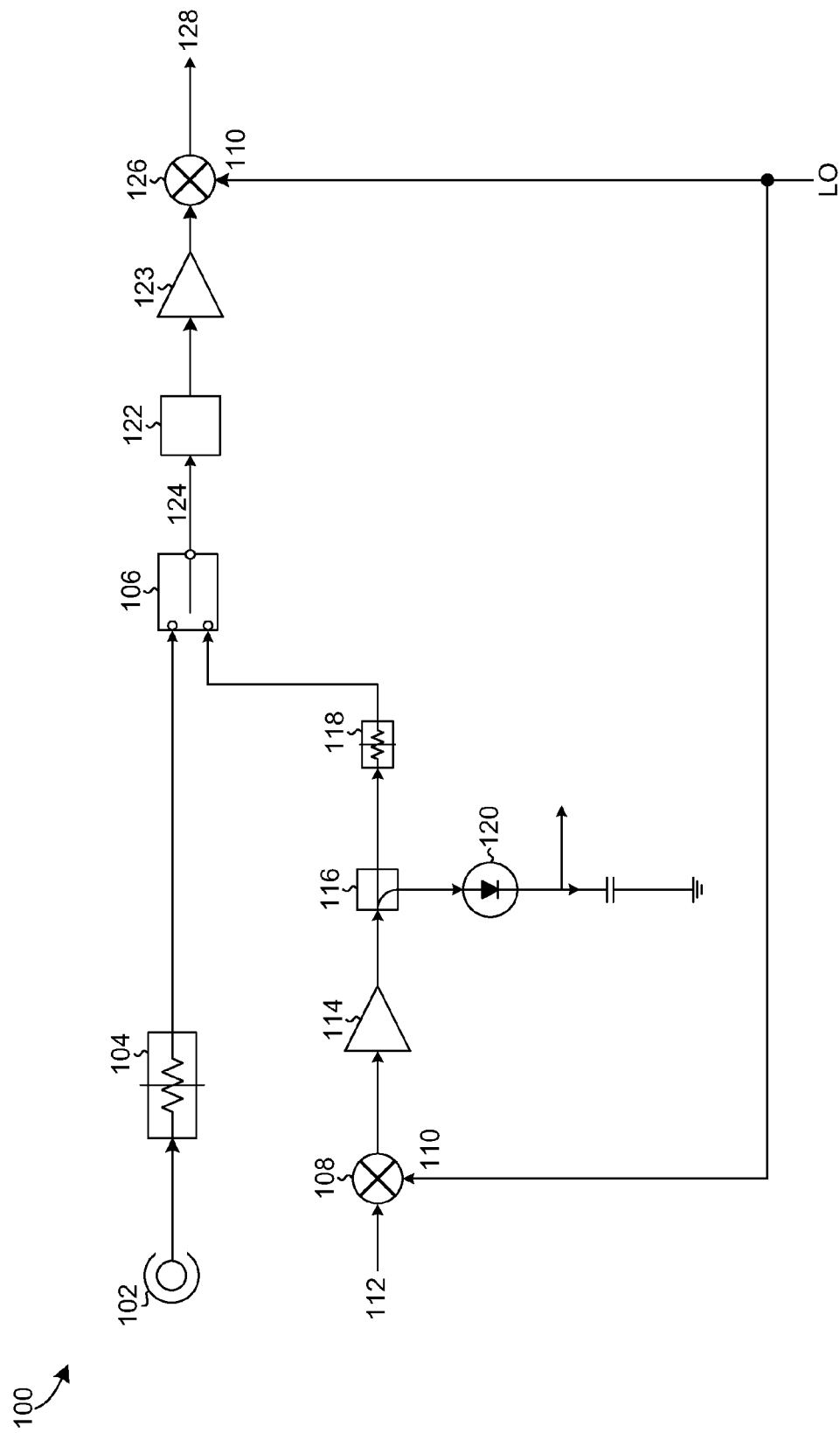
FIG. 1 illustrates a schematic view of a first example of a system in accordance with certain embodiments of the disclosed technology.

FIG. 1 illustrates a schematic view of a first example 100 of a system in accordance with certain embodiments of the disclosed technology. In the illustrated example 100, a radio frequency (RF) signal from an RF input 102 may be received by an optional input RF attenuator 104 before being provided to the first input of an electrical switch 106.

A local oscillator (LO) signal 110 is provided to a first mixer 108 and a second mixer 126. The first mixer 108 may allow for application of a frequency offset of the LO signal 110 and may optionally receive a modulation input 112 for certain types of processing such as two-tone processing, for example.

The resulting LO signal 110 may be amplified by an optional amplifier 114 before being provided to a power splitter 116, which may provide the signal to a calibrated power detector 120 and also to an optional LO attenuator 118 before providing the signal to the second input of the electrical switch 106.

In the example, the electrical switch 106 is configured to pass the selected signal to an RF path 124. The RF path 124 signal may pass through an optional instrument filter 122, a preamplifier 123, or both before being provided to the second mixer 126, which is configured to output an intermediate frequency (IF) signal 128 that may be passed to other circuitry for further conversion, such as an analog-to-digital converter (ADC), for example.

Figure 2:
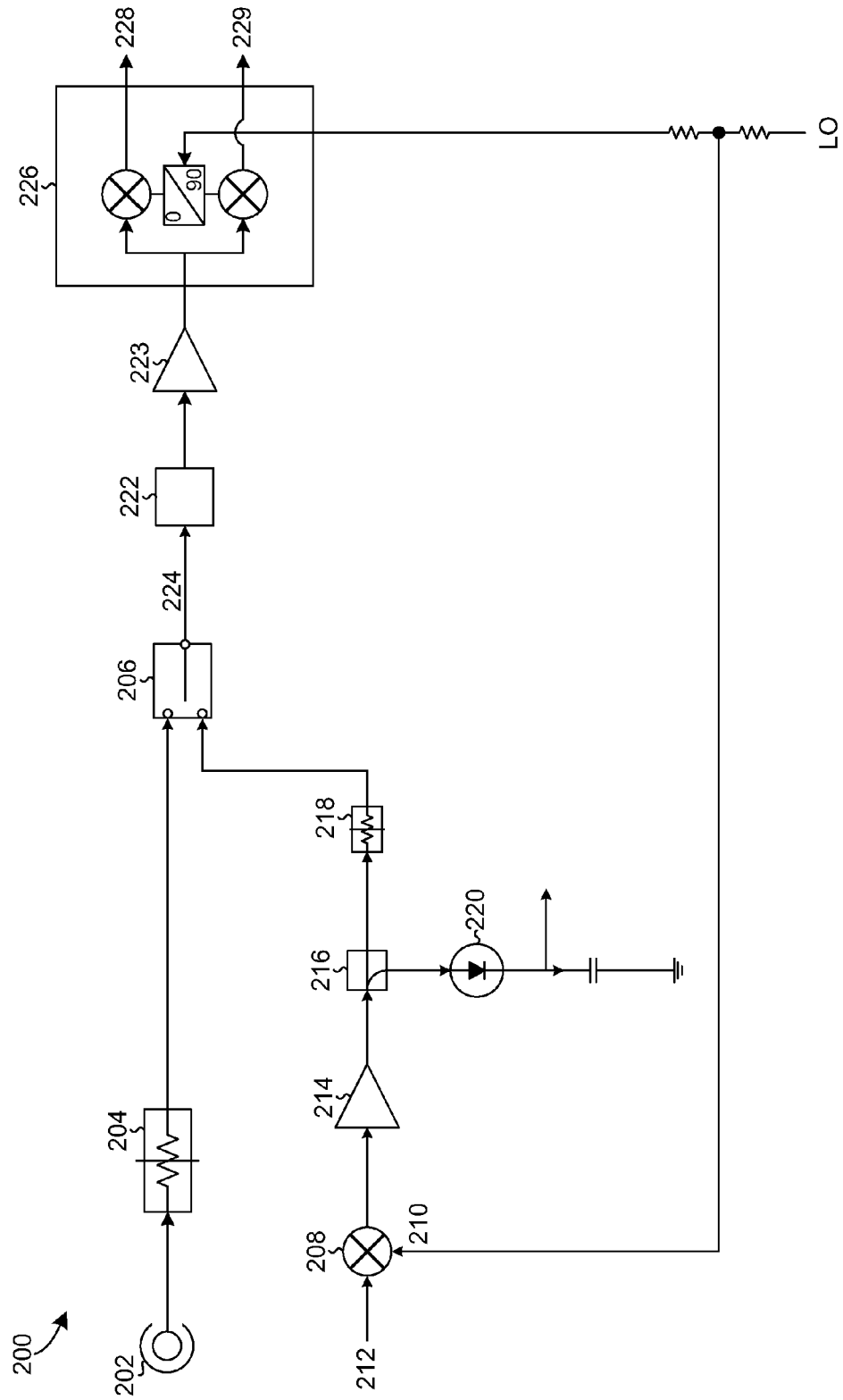
FIG. 2 illustrates a schematic view of a second example of a system in accordance with certain embodiments of the disclosed technology.

FIG. 2 illustrates a schematic view of a second example 200 of a system, in this case a direct conversion (zero IF or ZIF) example, in accordance with certain embodiments of the disclosed technology. In the illustrated example 200, an RF signal from an RF input 202 may be received by an optional input RF attenuator 204 before being provided to the first input of an electrical switch 206.

An LO signal 210 may be provided to an optional first mixer 208, which may also receive a modulation input 212.

The resulting LO signal may be amplified by an optional first amplifier 214 before being provided to a power splitter 216, which may provide output to a calibrated power detector 220 and also to an optional LO attenuator 218 before providing the signal to the second input of the electrical switch 206.

In the example, the electrical switch 206 is configured to pass the selected signal to an RF path 224. The RF path 224 signal may pass through an optional instrument preamplifier 222, a filter 223, or both before being provided to a quadrature (I/Q) mixer 226, which also receives the LO signal 210 for direct (I/Q conversion of the RF path 224 signal. Each of the resulting output signals 228 and 228 may be passed to other circuitry (not shown) for further processing.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A system, comprising:
   an input signal source configured to provide an input signal;
   a local oscillator (LO) configured to provide an LO signal; and
   an intermediate frequency (IF) receiver, the IF receiver comprising:
      a first input configured to receive the input signal from the input signal source;
      a second input configured to receive the LO signal from the LO;
      a first mixer configured to generate a calibration signal from the LO signal;
      a switch component configured to switch between the input signal and the calibration signal to provide a radio frequency (RF) signal;
      a power splitter coupled between the first mixer and the switch component; and
      a second mixer configured to generate an IF signal from the RF signal based on the LO signal.

2. The system of claim 1, wherein the IF receiver further comprises a power detector electrically coupled with the power splitter and configured to detect a power level of the calibration signal.

3. The system of claim 1, wherein the IF receiver further comprises an input attenuator electrically coupled between the first input and the switch component and configured to attenuate the input signal.

4. The system of claim 1, wherein the IF receiver further comprises an LO attenuator electrically coupled between the power splitter and the switch component and configured to attenuate the calibration signal.

5. The system of claim 1, wherein the IF receiver further comprises an instrument preamplifier configured to amplify the RF signal.

6. The system of claim 1, wherein the IF receiver further comprises an input amplifier coupled between the first mixer and the power splitter, the input amplifier configured to amplify the calibration signal.

7. The system of claim 1, wherein the IF receiver further comprises a filter electrically coupled between the switch component and the second mixer.

8. A system, comprising:
   an input signal source configured to provide an input signal;
   a local oscillator (LO) configured to provide a LO signal; and
   a zero intermediate frequency (ZIF) receiver, the ZIF receiver comprising:
      a first input configured to receive the input signal from the input signal source;
      a second input configured to receive the LO signal from the LO;
      a first mixer configured to generate a calibration signal from the LO signal;
      a switch component configured to switch between the input signal and the calibration signal to provide a radio frequency (RF) signal;
      a power splitter coupled to switch between the first mixer and the switch component; and
      a quadrature mixer configured to generate a ZIF signal from the RF signal based on the LO signal.

9. The system of claim 8, wherein the ZIF receiver further comprises a power detector electrically coupled with the power splitter and configured to detect a power level of the calibration signal.

10. The system of claim 8, wherein the ZIF receiver further comprises an input attenuator electrically coupled between the first input and the switch component and configured to attenuate the input signal.

11. The system of claim 8, wherein the ZIF receiver further comprises an LO attenuator electrically coupled between the power splitter and the switch component and configured to attenuate the calibration signal.

12. The system of claim 8, wherein the ZIF receiver further comprises an instrument preamplifier configured to amplify the RF signal.

13. The system of claim 8, wherein the ZIF receiver further comprises an input amplifier coupled between the first mixer and the power splitter, the input amplifier configured to amplify the calibration signal.

14. The system of claim 8, wherein the ZIF receiver further comprises a filter electrically coupled between the switch component and the second mixer.

* * * * *

UNITED STATES PATENT AND TRADEMARK OFFICE
CERTIFICATE OF CORRECTION

PATENT NO.       : 8,929,845 B2                                          Page 1 of 1
APPLICATION NO.  : 13/774799
DATED            : January 6, 2015
INVENTOR(S)      : Franklin Merlin Borden It is certified that error appears in the above-identified patent and that said Letters Patent is hereby corrected as shown below:

In column 4, line 21, replace "coupled to switch between" with -- coupled between --.

Signed and Sealed this
Twenty-third Day of August, 2016

Michelle K. Lee
*Director of the United States Patent and Trademark Office*